United States Patent
Hou et al.

(10) Patent No.: US 11,963,300 B2
(45) Date of Patent: Apr. 16, 2024

(54) PANEL DEVICE AND MANUFACTURING METHOD OF PANEL DEVICE

(71) Applicant: Au Optronics Corporation, Hsinchu (TW)

(72) Inventors: Chun-Yueh Hou, Hsinchu (TW); Hao-An Chuang, Hsinchu (TW); Fan-Yu Chen, Hsinchu (TW); Hsi-Hung Chen, Hsinchu (TW); Yun Cheng, Hsinchu (TW); Wen-Chang Hsieh, Hsinchu (TW); Chih-Wen Lu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 33 days.

(21) Appl. No.: 17/371,135

(22) Filed: Jul. 9, 2021

(65) Prior Publication Data

US 2022/0053638 A1 Feb. 17, 2022

Related U.S. Application Data

(60) Provisional application No. 63/065,641, filed on Aug. 14, 2020.

(30) Foreign Application Priority Data

Apr. 9, 2021 (TW) ................... 110112830

(51) Int. Cl.
*H05K 1/11* (2006.01)
*H05K 3/22* (2006.01)
*H05K 3/46* (2006.01)

(52) U.S. Cl.
CPC ............... *H05K 1/111* (2013.01); *H05K 3/22* (2013.01); *H05K 3/4644* (2013.01); *H05K 2201/10227* (2013.01)

(58) Field of Classification Search
CPC . H05K 1/11; H05K 3/22; H05K 1/111; H05K 3/4644; H05K 2201/10227
(Continued)

(56) References Cited

U.S. PATENT DOCUMENTS 5,694,155 A 12/1997 Stapleton et al.
6,277,745 B1 8/2001 Liu et al.
(Continued)

FOREIGN PATENT DOCUMENTS

CN 1662846 8/2005
CN 108957878 12/2018
(Continued)

*Primary Examiner* — Tremesha S Willis
(74) *Attorney, Agent, or Firm* — JCIPRNET

(57) ABSTRACT

A panel device including a substrate, a conductor pad, a turning wire, and a circuit board is provided. The substrate has a first surface and a second surface connected to the first surface while a normal direction of the second surface is different from a normal direction of the first surface. The conductor pad is disposed on the first surface of the substrate. The turning wire is disposed on the substrate and extends from the first surface to the second surface. The turning wire includes a wiring layer in contact with the conductor pad and a wire covering layer covering the wiring layer. The circuit board is bonded to and electrically connected to the wire covering layer. A manufacturing method of a panel device is also provided herein.

8 Claims, 9 Drawing Sheets

(58) Field of Classification Search
USPC .......................................................... 174/261
See application file for complete search history.

(56) References Cited

U.S. PATENT DOCUMENTS

| | | | |
|---|---|---|---|
| 7,826,023 | B2 | 11/2010 | Grupp et al. |
| 2001/0035582 | A1 | 11/2001 | Tesauro et al. |
| 2005/0237445 | A1 | 10/2005 | Grupp et al. |
| 2008/0296591 | A1 | 12/2008 | Lin et al. |
| 2018/0192521 | A1 | 7/2018 | Shpaisman et al. |
| 2022/0102467 | A1* | 3/2022 | Song ...................... H10K 59/40 |

FOREIGN PATENT DOCUMENTS

| | | |
|---|---|---|
| CN | 210626839 | 5/2020 |
| TW | 202008043 | 2/2020 |

\* cited by examiner

PANEL DEVICE AND MANUFACTURING METHOD OF PANEL DEVICE

CROSS-REFERENCE TO RELATED APPLICATION

This application claims the priority benefits of U.S. provisional application Ser. No. 63/065,641, filed on Aug. 14, 2020, and Taiwanese application no. 110112830, filed on Apr. 9, 2021. The entirety of each of the above-mentioned patent applications is hereby incorporated by reference herein and made a part of this specification.

BACKGROUND

Technical Field

The disclosure relates to a panel device and a manufacturing method of a panel device.

Description of Related Art

In response to the diversified applications of panel devices, various manufacturing technologies and product designs are constantly innovated. In order to provide more diversified applications, products with narrow borders or no borders are provided one after another. For example, in addition to providing functional regions (e.g., a display region and a touch region) with a relatively great area, the products with narrow borders or no borders may be applied in spliced products (e.g., spliced display panels).

SUMMARY

The disclosure provides a panel device.

The disclosure provides a manufacturing method of a panel device, in which stable lateral wires can be manufactured to improve the yield of the lateral wires.

A panel device of the disclosure includes a substrate, a conductor pad, a turning wire, and a circuit board. The substrate has a first surface and a second surface connected to the first surface while a normal direction of the second surface is different from a normal direction of the first surface. The conductor pad is disposed on the first surface of the substrate. The turning wire is disposed on the substrate and extends from the first surface to the second surface. The turning wire includes a wiring layer in contact with the conductor pad and a wire covering layer covering the wiring layer. The circuit board is bonded to and electrically connected to the wire covering layer.

A manufacturing method of a panel device of the disclosure includes, but is not limited to, the following. A conductor material layer is formed on a substrate. The conductor material layer continuously extends from a first surface of the substrate to a second surface of the substrate. A normal direction of the first surface is different from a normal direction of the second surface. A wire covering layer is formed on the conductor material layer, and the conductor material layer is patterned with the wire covering layer serving as a mask to form a wiring layer. An outline of the wiring layer is recessed relative to an outline of the wire covering layer. The wiring layer continuously extends from the first surface to the second surface of the substrate. A circuit board is bonded to the wire covering layer.

Based on the foregoing, the panel device of the embodiments of the disclosure includes the turning wire continuously extending from the first surface to the second surface of the substrate, and the circuit board is bonded to surfaces other than the first surface. Therefore, the panel device can have a relatively great element configuration area on the first surface for functional elements to be disposed on, and the panel device can have a narrow border design.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
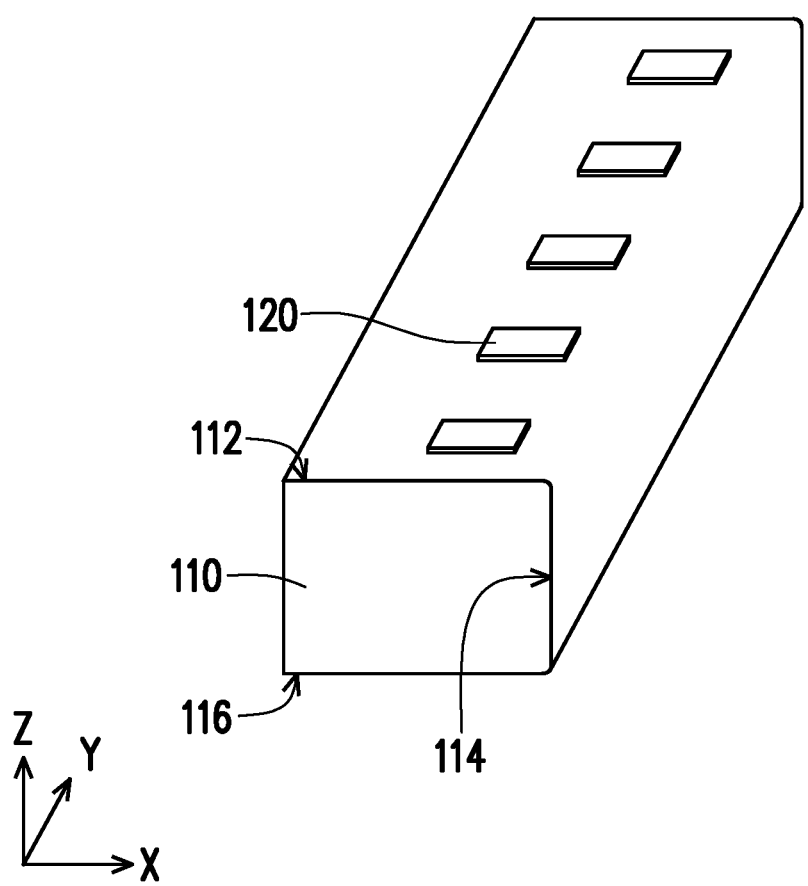
FIG. 1 to FIG. 4 show partial steps of manufacturing a panel device according to some embodiments of the disclosure.

In the drawings of the disclosure, the X-direction, Y-direction, and Z-direction are labeled to present the configuration relationship between each member in the figure. The X-direction, Y-direction, and Z-direction intersect each other, but are not limited to being orthogonal to each other. FIG. 1 to FIG. 4 show partial steps of manufacturing a panel device according to some embodiments of the disclosure. In FIG. 1, a conductor pad 120 is formed on a substrate 110 in advance. The substrate 110 is a plate or the like having a certain mechanical strength and may carry objects for a plurality of film layers and/or a plurality of objects to be disposed thereon. In some embodiments, the material of the substrate 110 includes glass, polymer materials, ceramics, and the like. In other embodiments, the substrate 110 may be a multilayer substrate formed by stacking a plurality of sublayers. The substrate 110 has a first surface 112, a second surface 114, and a third surface 116. The second surface 114 is connected between the first surface 112 and the third surface 116. Herein, a normal direction of the second surface 114 is different from a normal direction of the first surface 112 and also different from a normal direction of the third surface 116. In some embodiments, the normal directions of the first surface 112 and the third surface 116 may be parallel to each other, but not limited thereto. For example, the first surface 112 and the third surface 116 are each a plane parallel to the X direction-Y direction, and the second surface 114 is a plane parallel to the Y direction-Z direction. In some other embodiments, members disposed on the second surface 114 may be applied to other second surfaces, such as a second surface parallel to the X direction-Z direction.

In some embodiments, a pixel circuit structure (not shown in FIG. 1) electrically connected to the conductor pad 120 may also be disposed on the first surface 112 of the substrate 110. For example, the pixel circuit structure (not shown in FIG. 1) may include a signal line, an active element, a passive element, and the like. The active element is, for example, a transistor and the passive element is, for example, a capacitor structure, but they are not limited thereto. In some embodiments, the pixel circuit structure (not shown in FIG. 1) may be fabricated on the first surface 112 of the substrate 110 by film layer deposition combined with photolithography or printing. Therefore, the transistor may be a thin film transistor, and the capacitor structure may be formed by stacking a conductive layer and a dielectric layer. In addition, in some embodiments, the pixel circuit structure may also include pixel pads configured for bonding functional elements such as display elements and light-emitting elements.

In FIG. 1, the conductor pad 120 includes a plurality of conductor pads 120, and the conductor pads 120 may be arranged along the Y direction. The conductor pads 120 are located on the first surface 112, and are disposed on the periphery of the substrate 110. In some embodiments, the conductor pads 120 may extend to the second surface 114 and the first surface 112, and may even be aligned with the second surface 114. For example, the tip of the conductor pads 120 may be coplanar with the second surface 114.

Figure 2:
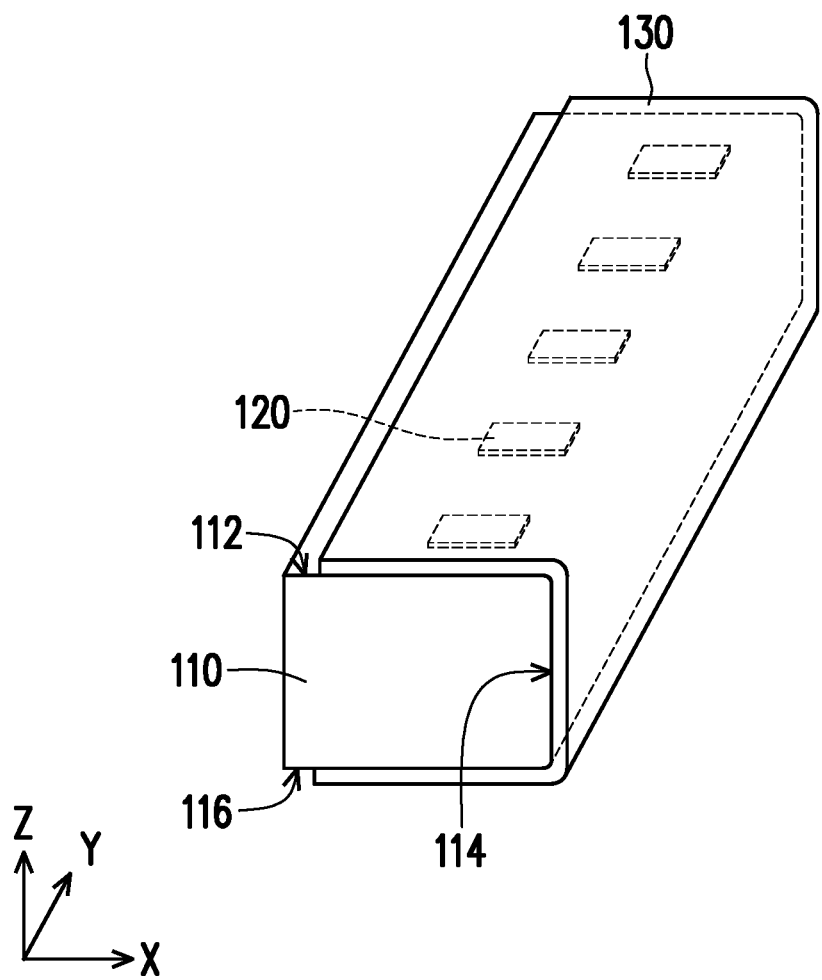

In FIG. 2, a conductor material layer 130 is formed on the substrate 110. The conductor material layer 130 may cover the peripheral parts of the substrate 110. The conductor material layer 130 may continuously extend from the first surface 112 to the second surface 114, and may even extend to the third surface 116. The conductor material layer 130 may be formed on the substrate 110 by edge sputtering. The material of the conductor material layer 130 includes copper, aluminum, molybdenum, silver, gold, nickel, titanium, ITO, IGZO, and the like. The conductor material layer 130 may be in contact with and directly cover the conductor pad 120. When a pad (not shown) is disposed on the third surface 116, the conductor material layer 130 may further be in contact with and directly cover the pad on the third surface 116.

Figure 3:
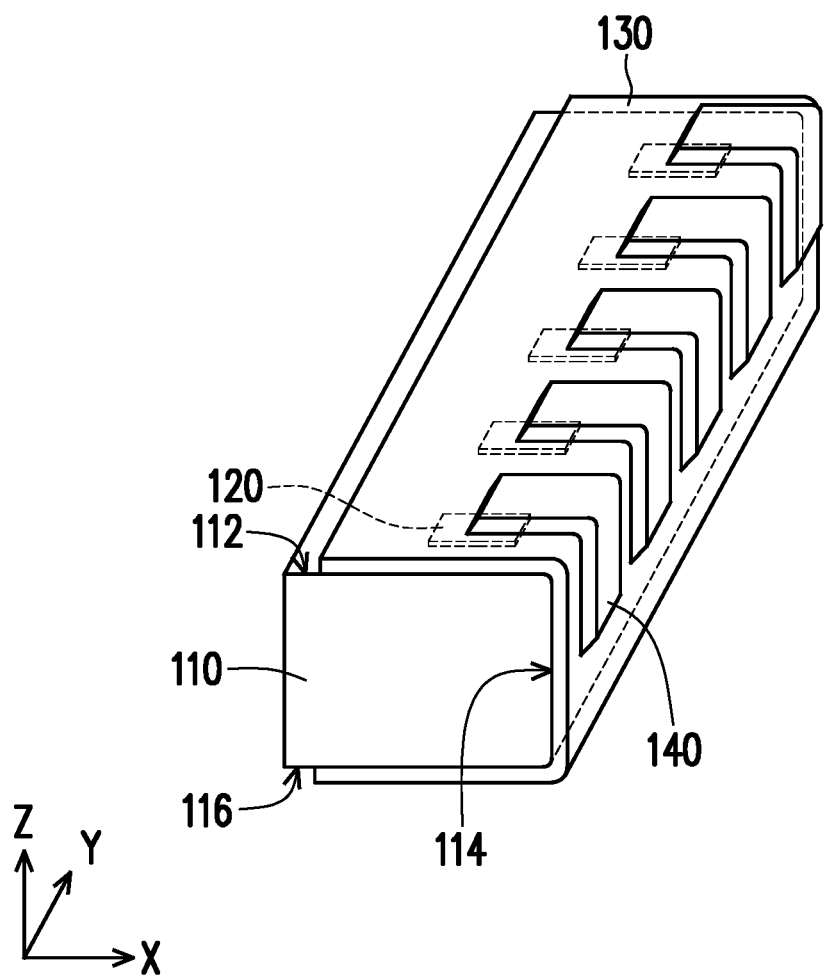

In FIG. 3, a wire covering layer 140 is formed on the conductor material layer 130. The wire covering layer 140 may be fabricated on the substrate 110 by transfer printing. The wire covering layer 140 may have a strip-shaped pattern, and the wire covering layer 140 may continuously extend from the first surface 112 through the second surface 114 to the third surface 116. As shown in FIG. 3, a plurality of strip-shaped wire covering layers 140 may be arranged along the Y direction, and the plurality of strip-shaped wire covering layers 140 may be disposed corresponding to the conductor pads 120. In some embodiments, the orthographic projection of the wire covering layers 140 on the first surface 112 in the Z direction may overlap the orthographic projection of the conductive pads 120 (and the corresponding second pads) on the first surface 112 in the Z direction. Moreover, the orthographic projection of the conductive pads 120 on the first surface 112 in the Z direction may be completely within the orthographic projection of the wire covering layers 140 on the first surface 112 in the Z direction. The plurality of strip-shaped wire covering layers 140 are disposed in a one-to-one correspondence with the conductive pads 120, so each wire covering layer 140 overlaps only one conductive pad 120.

In some embodiments, the wire covering layer 140 may be fabricated on the substrate 110 by printing. For example, in some fabricating processes, a conductive pattern may be first coated on or applied to a printing tool, and then the printing tool is pressed against the second surface 114 of the substrate 110, such that the conductive pattern on the printing tool is attached onto the conductor material layer 130. Next, after the printing tool is removed, a step of curing may be performed on the conductive pattern attached to the conductor material layer 130 to form the wire covering layer 140. In other words, the wire covering layer 140 may be fabricated on the substrate 110 by imprinting. In some embodiments, the printing tool may have a printing structure in strip-shaped distribution, and the strip-shaped wire covering layer 140 may thus be formed on the conductor material layer 130.

In addition, the printed pattern may be fabricated with elastic materials, such as rubber. When the printing tool is pressed against the second surface 114 of the substrate 110, part of the printed pattern may be pressed against the conductor material layer 130 on the first surface 112 and the third surface 116 to imprint the conductive pattern onto the conductor material layer 130 on the first surface 112 and the third surface 116. For example, during the printing process, the printing tool may move toward the substrate 110 along the X direction to transfer print the conductive pattern onto the conductor material layer 130 on the second surface 114, the first surface 112, and the third surface 116. In other embodiments, it is also possible that, after moving toward the substrate 110 along the X direction to be pressed against the second surface 114, the printing tool is further rotated around the Y direction to transfer print the corresponding conductive patterns onto the conductor material layer 130 on the first surface 112 and the third surface 116.

Figure 4:
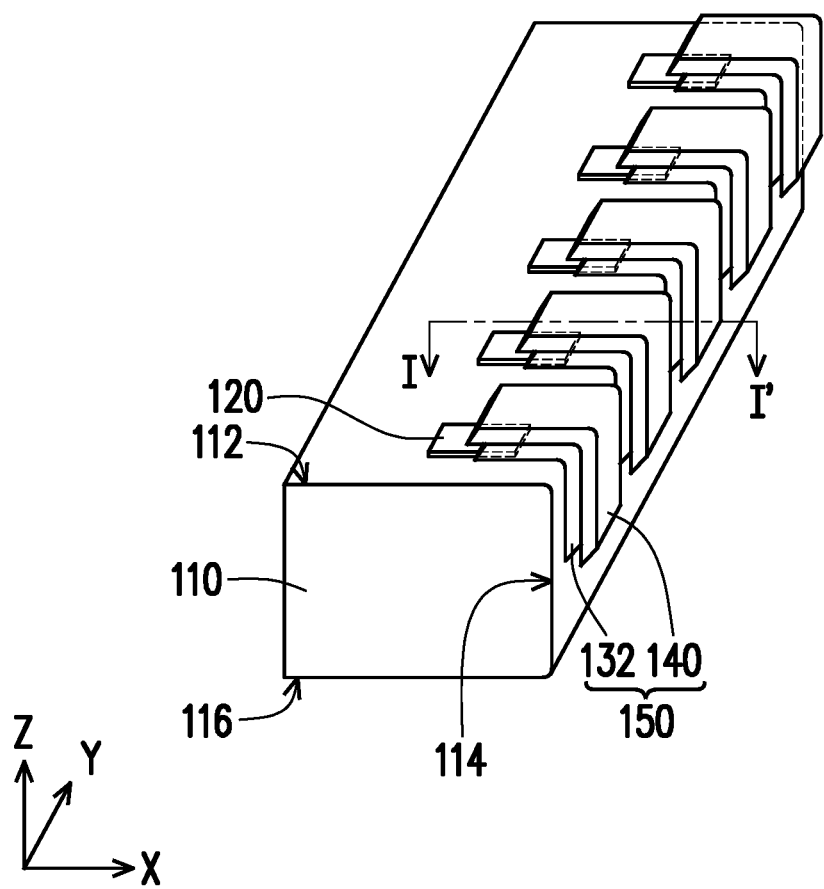

After the fabrication of the wire covering layer 140 of FIG. 3 is completed, a step of patterning may be performed to remove the conductor material layer 130 not covered by the wire covering layer 140 to form wiring layers 132 as shown in FIG. 4. The conductor material layer 130 may be patterned by isotropic etching. For example, the step of patterning includes, for example, patterning the conductor material layer 130 with the wire covering layer 140 serving as a mask, such that the conductor material layer 130 not covered by the wire covering layer 140 is in contact with an etchant to be removed to form the wiring layers 132. Herein, the etchant adopted in the step of patterning is selective to the conductor material layer 130 and the wire covering layer 140. That is, the etchant adopted in the step of patterning, for example, does not react with the wire covering layer 140. Therefore, the wire covering layer 140 is substantially not damaged in the step of etching.

In some embodiments, to ensure that the wiring layers 132 are independent of each other without connection, the conductor material layer 130 may be over-etched. Accordingly, part of the conductor material layer 130 corresponding to the edge of the wire covering layer 140 may be removed, such that the wiring layer 132 may be recessed relative to the wire covering layer 140. For example, although an outline of the wiring layer 132 conforms to an outline of the wire covering layer 140, it is not aligned with the outline of the wire covering layer 140, but is recessed relative to the outline of the wire covering layer 140.

The material of the surface of the conductor pad 120 may be different from that of the wiring layer 132, so the conductor pad 120 and the wiring layer 132 are in heterogeneous contact with each other. In some embodiments, based on the selection of materials, it is possible that the conductor pad 120 is not damaged in the step of patterning the conductor material layer 130, such that the wiring layer 132 expose part of the conductor pad 120, but it is not limited thereto. For example, the etchant used in the step of patterning is selective to the material of the surface of the conductor pad 120 and the material of the conductor material layer 130.

In FIG. 4, the wiring layer 132 is disposed on the substrate 110 and corresponds to the wire covering layer 140. The wiring layer 132 and the wire covering layer 140 are in a one-to-one correspondence. In other words, the number of wiring layers 132 may be the same as the number of wire covering layers 140. Each wiring layer 132 is sandwiched between one of the strip-shaped wire covering layers 140 and the substrate 110, and extends from the first surface 112 of the substrate 110 through the second surface 114 of the substrate 110 to the third surface 116 of the substrate 110, thereby constituting a turning wire 150. That is, each turning wire 150 may include the wiring layer 132 and the wire covering layer 140. In some embodiments, the turning wire 150 may be electrically connected to the pixel circuit structure disposed on the substrate 110, and may be configured to be combined with other members, such as a circuit board.

Figure 5:
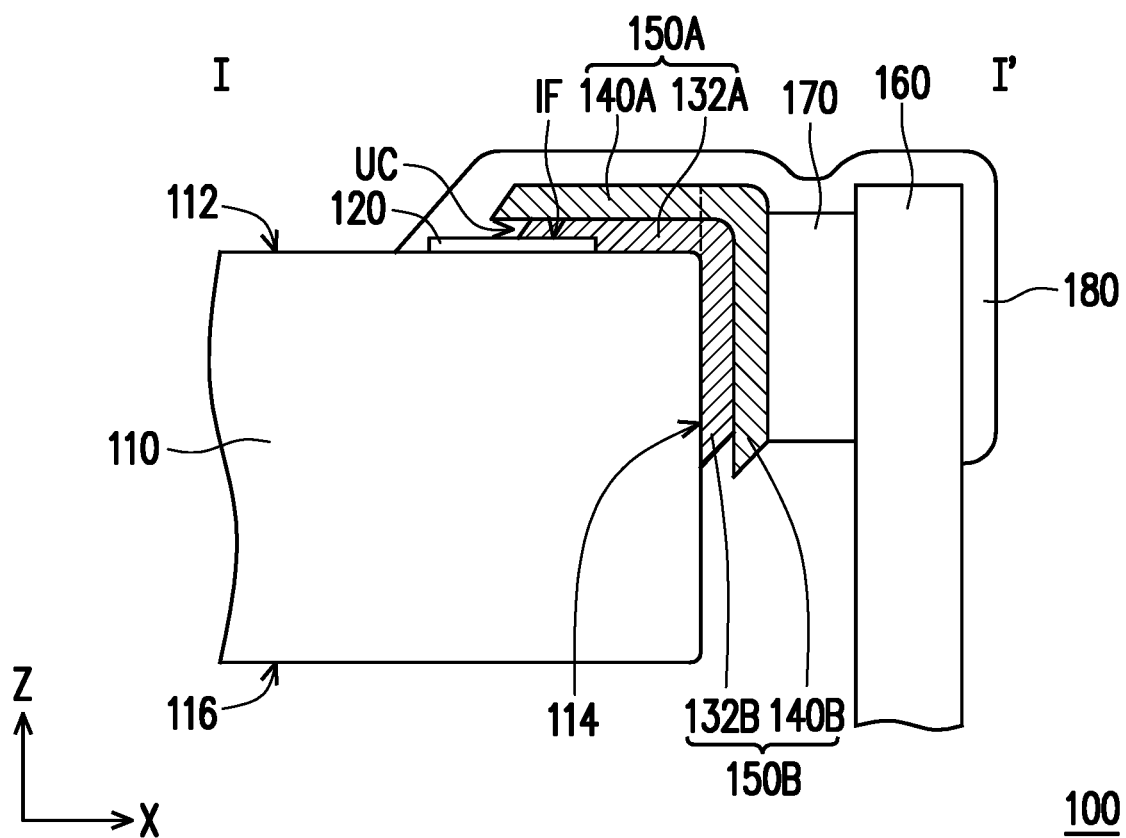
FIG. 5 to FIG. 9 are respectively schematic partial cross-sectional views of panel devices according to some embodiments of the disclosure.

After the step of manufacturing of FIG. 4, a circuit board may be bonded to the second surface 114 of the substrate 110 and a protective layer may be further formed on the substrate 110 to obtain a panel device 100 as shown in FIG. 5. FIG. 5 is a schematic partial cross-sectional view of a panel device according to an embodiment of the disclosure. The cross-sectional structure of FIG. 5 may correspond to line I-I' of FIG. 4. In FIG. 5, the panel device 100 may include the substrate 110, the conductor pad 120, the turning wire 150, a circuit board 160, a conductive bonding layer 170, and a protective layer 180. The turning wire 150 may be fabricated using the steps of manufacturing of FIG. 1 to FIG. 4. Accordingly, reference may be made to the description of FIG. 1 to FIG. 4 for the relative configuration relationship between the substrate 110, the conductor pad 120, and the turning wire 150.

Specifically, the substrate 110 is, for example, a glass substrate, a quartz substrate, a ceramic substrate, a polymer substrate, a composite substrate, or other plate or the like being supporting and having sufficient mechanical strength. The substrate 110 has the first surface 112, the second surface 114, and the third surface 116. The second surface 114 is connected between the first surface 112 and the third surface 116. The normal direction of the second surface 114 is different from the normal direction of the first surface 112 and also different from the normal direction of the third surface 116. The normal directions of the first surface 112 and the third surface 116 may be the same, for example, may both be parallel to the Z direction, and the normal direction of the second surface 114 may be, for example, parallel to the X direction, but not limited thereto. In some embodiments, the substrate 110 may be a transparent substrate, but in some other embodiments, the substrate 110 may be an opaque substrate.

The conductor pad 120 is disposed on the first surface 112 of the substrate 110 and is configured to provide an electrical transmission channel to electrically connect the pixel circuit structure (not shown) on the substrate 110 to other members, such as the circuit board 160. In the process of fabricating the conductor pad 120 on the first surface 112 of the substrate 110, the pixel circuit structure may be fabricated on the first surface 112 together. The so-called pixel circuit structure may include an active component, a capacitor, a signal line, and the like. In the meanwhile, the conductor pad 120 may be connected to the signal line in the pixel circuit structure to transmit electrical signals to the pixel circuit structure. In some embodiments, the panel device 100 also includes functional elements disposed on the first surface 112 to provide required functions. For example, the functional elements may include a light-emitting element, a display element, a touch element, a sensing element, and the like. The pixel circuit structure may be configured to drive the functional elements, such that the panel device 100 provides a light-emitting function, a display function, a touch function, a sensing function, or a combination thereof. In other words, the panel device 100 may be a light-emitting panel, a display panel, a touch panel, a sensing panel, or a multi-function panel.

The turning wire 150 is disposed on the substrate 110 and includes the wiring layer 132 and the wire covering layer 140 covering the wiring layer 132. That is, the wiring layer 132 is disposed between the wire covering layer 140 and the substrate 110. The wiring layer 132 close to the substrate 110 may be in direct contact with the conductor pad 120. In some embodiments, the material of the surface of the conductor pad 120 is different from that of the wiring layer 132, so a heterogeneous contact interface IF is present between the conductive pad 120 and the wiring layer 132.

The material of the wiring layer 132 may include metals, such as copper, aluminum, molybdenum, silver, gold, nickel, titanium, aluminum zinc oxide (AZO), and the like. In some embodiments, the wiring layer 132 per se may be multiple conductive layers formed by stacking a plurality of conductive layers. The material of the wire covering layer 140 may include a printable conductive material. In some embodiments, the material of the wire covering layer 140 includes a silver paste layer, a solder layer, an anisotropic conductive layer, and the like. The conductivity of the wiring layer 132 may be greater than the conductivity of the wire covering layer 140.

The circuit board 160 may be bonded to the wire covering layer 140 and electrically connected to the wire covering layer 140, so as to be electrically connected to the conductor pad 120 on the first surface 112 through the turning wire 150. Due to the conductivity of the wire covering layer 140, the circuit board 160 does not require to be in contact with the wiring layer 132. In this embodiment, the circuit board 160 may be bonded to the turning wire 150 through the conductive bonding layer 170. The material of the conductive bonding layer 170 may include an anisotropic conductive adhesive, solder, or other materials that can provide conductive bonding. In some embodiments, the circuit board 160 may be in direct contact with the wire covering layer 140 of the turning wire 150 without being bonded through the conductive bonding layer 170 to the turning wire 150.

In FIG. 5, the outline of the wiring layer 132 may be recessed relative to the wire covering layer 140, forming an undercut structure UC on the periphery of the turning wire 150. In addition, the conductor pad 120 may be partially covered by the wiring layer 132 and partially not covered by the wiring layer 132. Therefore, the turning wire 150 does not completely cover the conductor pad 120. The protective layer 180 is continuously disposed at least from the first surface 112 to the second surface 114 of the substrate 110 and covers the conductor pad 120, part of the transfer wiring 150, the conductive bonding layer 170, and the circuit board 160. The protective layer 180 may fill the undercut structure UC, and can prevent the conductor pad 120, the transfer wiring 150, and other members from oxidation, deterioration, peeling, or the like caused by exposure. The material of the protective layer 180 may include organic insulating materials.

The turning wire 150 continuously extends from the first surface 112 to the second surface 114. The turning wire 150 may include a first direction portion 150A and a second direction portion 150B. The first direction portion 150A is disposed on the first surface 112 and the second direction portion 150B is disposed on the second surface 114. In other words, the first direction portion 150A and the second direction portion 150B are located on different planes. Therefore, the turning wire 150 is a three-dimensional wire extending between different planes.

In this embodiment, the first direction portion 150A includes a first part 132A of the wiring layer 132 and a first part 140A of the wire covering layer 140, and the second direction portion 150B includes a second part 132B of the wiring layer 132 and a second part 140B of the wire covering layer 140. The first part 132A of the wiring layer 132 is located between the first part 140A of the wire covering layer 140 and the first surface 112 of the substrate 110. The second part 132B of the wiring layer 132 is located between the second part 140B of the wire covering layer 140 and the second surface 114 of the substrate 110.

The first part 132A of the wiring layer 132 covers and is in contact with the conductor pad 120. The circuit board 160 is bonded to the second part 140B of the wire covering layer 140 through the conductive bonding layer 170. As such, the turning wire 150 may be configured to realize the structure in which the circuit board 160 is laterally bonded. In this embodiment, the design in which the circuit board 160 is bonded to the second surface 114 of the substrate 110 reduces the area occupied by the bonding structure of the circuit board 160 on the first surface 112, realizing a narrow border design.

Generally speaking, when the circuit board 160 is bonded to the first surface 112 of the substrate 110, a bonding area of about 500 micrometers or greater requires to be reserved on the first surface 112, resulting in a necessary reduction of the area where functional elements such as light-emitting elements and display elements can be disposed on the first surface 112. In contrast, in this embodiment, the circuit board 160 is bonded to the second surface 114 of the substrate 110, apparently increasing the area where functional elements such as light-emitting elements and display elements may be disposed on the first surface 112, thus helping to realize a narrow border design or to provide a greater area utilization rate on the first surface 112.

Figure 6:
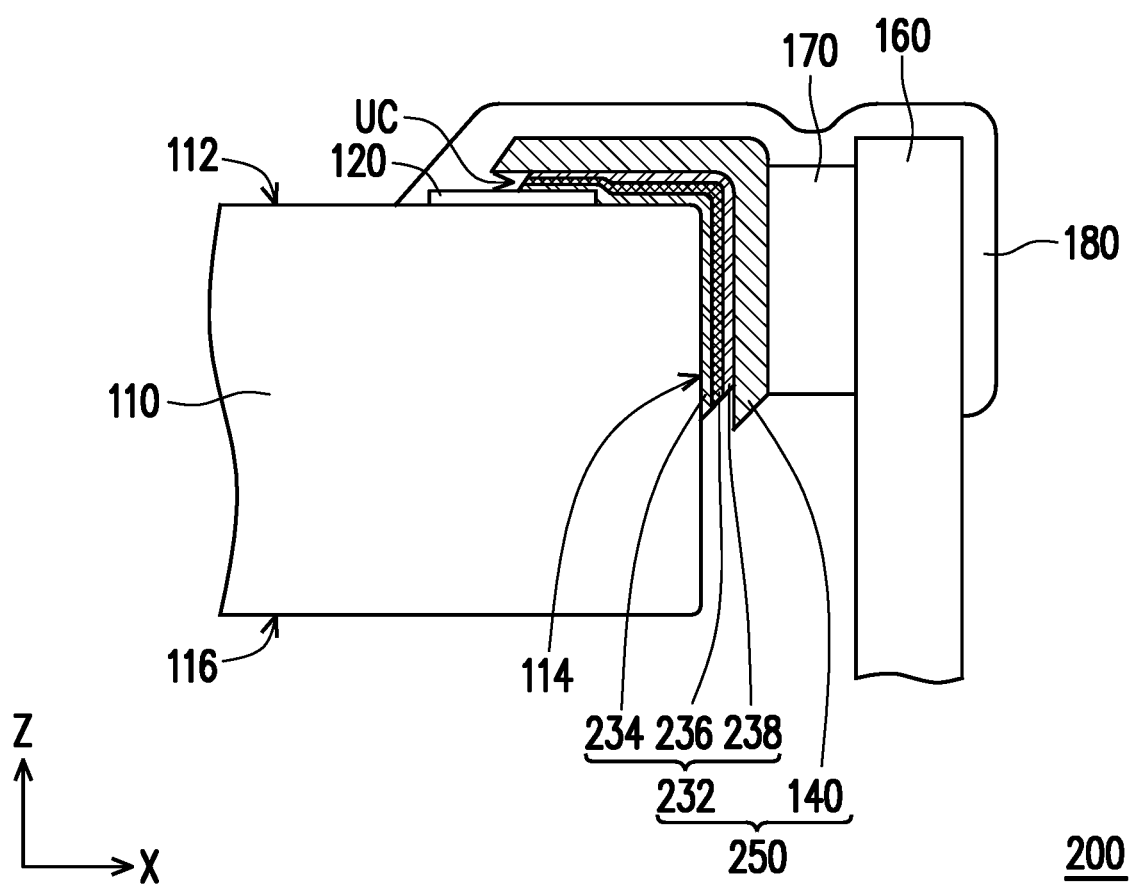

FIG. 6 is a schematic partial cross-sectional view of a panel device according to an embodiment of the disclosure. In FIG. 6, a panel device 200 may include the substrate 110, the conductor pad 120, a turning wire 250, the circuit board 160, the conductive bonding layer 170, and the protective layer 180. The turning wire 250 may be fabricated using the steps of manufacturing of FIG. 1 to FIG. 4. Accordingly, reference may be made to the description of FIG. 1 to FIG. 4 for the relative configuration relationship of the substrate 110, the conductor pad 120, and the turning wire 250. In addition, the panel device 200 is largely similar to the panel device 100, while the panel device 200 is different from the panel device 100 mainly in the design of the turning wire 250 of the panel device 200. Therefore, the same reference numerals in the two embodiments denote the same members and may be cross-referenced and applied to each other.

Specifically, the turning wire 250 of the panel device 200 includes a wiring layer 232 and the wire covering layer 140. For the structure, material, and property of the wire covering layer 140, reference may made be to the description in the foregoing embodiments, which will not be repeated. The wiring layer 232 is formed of multiple conductor layers, and includes a buffer conductor layer 234, a circuit conductor layer 236, and a protective conductor layer 238. The buffer conductor layer 234, the circuit conductor layer 236, and the protective conductor layer 238 are sequentially stacked on the substrate 110. The turning wire 250 may be fabricated using the steps of manufacturing of FIG. 1 to FIG. 4. In the step of FIG. 2, the materials corresponding to the buffer conductor layer 234, the circuit conductor layer 236, and the protective conductor layer 238 may be sequentially formed on the substrate 110, forming the wiring layer 232 of FIG. 6.

In some embodiments, the material of the buffer conductor layer 234 may include molybdenum or the like, the material of the circuit conductor layer 236 may include copper or the like, and the material of the protective conductor layer 238 may include molybdenum, AZO, or the like. The adhesion of the buffer conductor layer 234 to the substrate 110 may be greater than the adhesion of the circuit conductor layer 236 to the substrate 110. The conductivity of the circuit conductor layer 236 may be greater than the conductivity of the buffer conductor layer 234. Accordingly, the stack of the buffer conductor layer 234 and the circuit conductor layer 236 provides satisfactory adhesion, low likelihood of peeling off, and satisfactory conductivity. Since the protective conductor layer 238 is less likely to be oxidized or deteriorated than the circuit conductor layer 236, the protective conductor layer 238 may serve as a protective layer, such that the circuit conductor layer 236 maintains good conductivity. Accordingly, in the multi-layer design of the turning wire 250, the conductivity, stability, and reliability of the turning wire 250 can be ensured. Since the required patterns of the buffer conductor layer 234, the circuit conductor layer 236, and the protective conductor layer 238 are formed in the same step of patterning (e.g., the step of FIG. 4), the buffer conductor layer 234, the circuit conductor layer 236, and the protective conductor layer 238 do cover each other on the sidewall. Moreover, the sidewall of each of the buffer conductor layer 234, the circuit conductor layer 236, and the protective conductor layer 238 may be recessed relative to the sidewall of the wire covering layer 140 to form the undercut structure UC.

Figure 7:
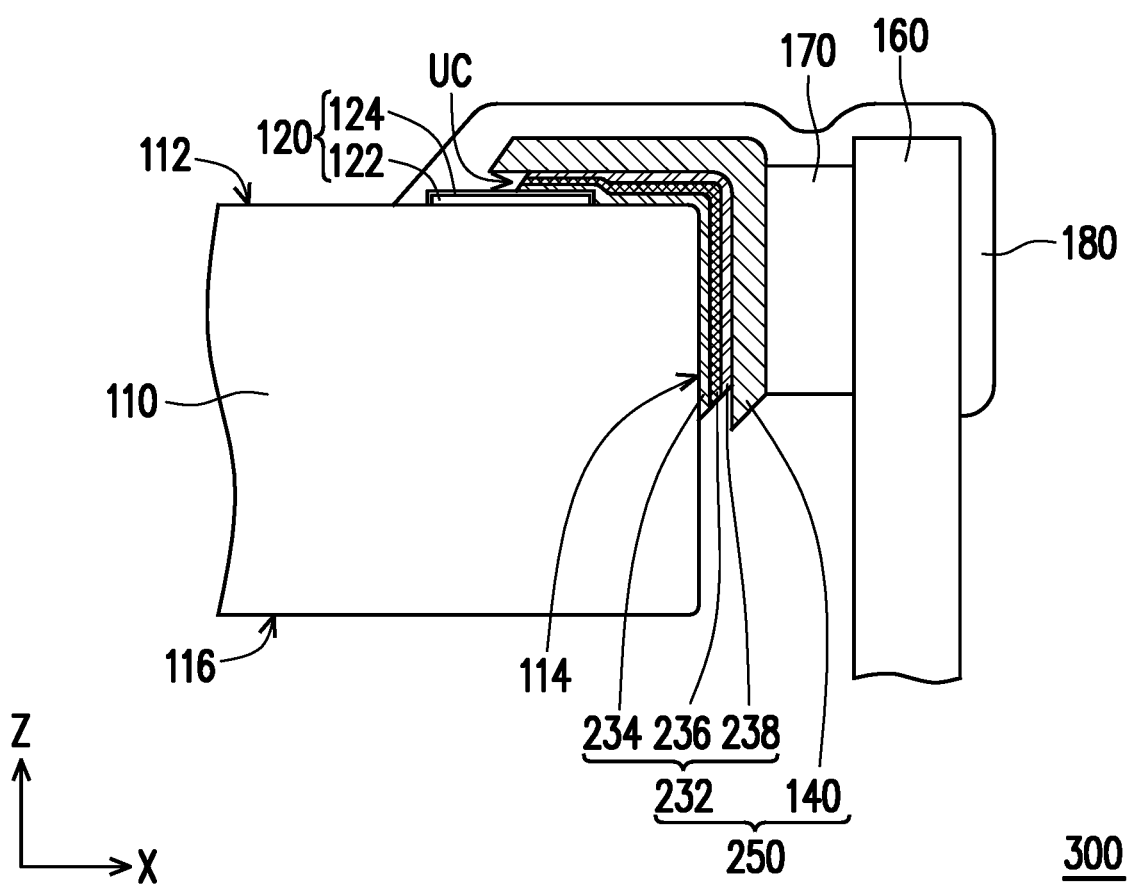

FIG. 7 is a schematic partial cross-sectional view of a panel device according to an embodiment of the disclosure. In FIG. 7, a panel device 300 may include the substrate 110, the conductor pad 120, the turning wire 250, the circuit board 160, the conductive bonding layer 170, and the protective layer 180. The turning wire 250 may be fabricated using the steps of manufacturing of FIG. 1 to FIG. 4. Accordingly, reference may be made to the description of FIG. 1 to FIG. 4 for the relative configuration relationship of the substrate 110, the conductor pad 120 and the turning wire 250. In addition, the panel device 300 is largely similar to the panel device 200, while the panel device 300 is different from the panel device 200 mainly in the specific structure of the conductor pad 120 of the panel device 300. Moreover, the specific structure of the conductor pad 120 described in this embodiment may be applied to any of the foregoing embodiments.

In this embodiment, the conductor pad 120 may include a conductor portion 122 and a surface portion 124, and the surface portion 124 covers the conductor portion 122. The material of the conductor portion 122 may include metal materials with good conductivity such as copper, aluminum, molybdenum, silver, gold, nickel, and titanium, and may adopt the same conductive material as the pixel circuit structure disposed on the substrate 110. The material of the surface portion 124 may include conductive oxides, such as indium tin oxide, indium zinc oxide, and the like. The surface portion 124 can protect the conductor portion 122 from oxidation or damage. In some embodiments, the conductor portion 122 may be formed by stacking a plurality of conductor material layers, such as a molybdenum-aluminum-molybdenum stack layer, a titanium-aluminum-titanium stack layer, or the like.

The turning wire 250 of this embodiment may be fabricated using the steps of manufacturing of FIG. 1 to FIG. 4. In the etching step (corresponding to the step of FIG. 4) of forming the wiring layer 232, the etchant is selective to the surface portion 124 of the conductor pad 120. In other words, the etchant is less likely to react with the material of the surface portion 124. Accordingly, the surface portion 124 is not subject to damage during the etching process. Therefore, the surface portion 124 may be exposed in the step of etching during fabricating the wiring layer 232. In other embodiments, the wiring layer 232 may optionally completely cover the conductor pad 120.

Furthermore, the wiring layer 232 includes the buffer conductor layer 234, the circuit conductor layer 236, and the protective conductor layer 238. In some embodiments, the surface portion 124 has less adhesion to the circuit conductor layer 236 and greater adhesion to the buffer conductor layer 234. Accordingly, the multilayer design of the wiring layer 232 helps to stabilize the contact between the wiring layer 232 and the conductor pad 120, thereby ensuring the electrical connection between the turning wire 250 and the conductor pad 120.

Figure 8:
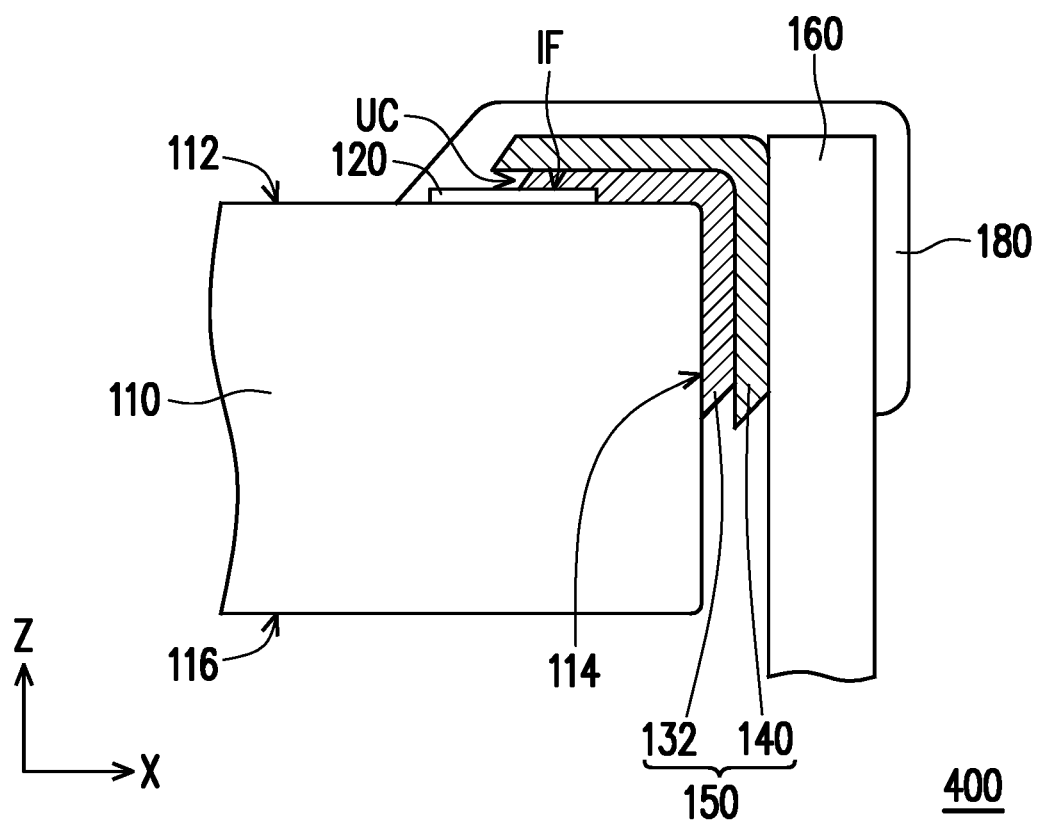

FIG. 8 is a schematic partial cross-sectional view of a panel device according to an embodiment of the disclosure. In FIG. 8, a panel device 400 may include the substrate 110, the conductor pad 120, the turning wire 150, the circuit board 160, and the protective layer 180. Reference may be made to the description of FIG. 1 to FIG. 4 for the manufacturing method of the substrate 110, the conductor pad 120, and the turning wire 150. In addition, the panel device 400 is largely similar to the panel device 100, while the panel device 400 is different from the panel device 100 mainly in that the panel device 400 does not include a bonding conductor layer.

Specifically, the turning wire 150 of the panel device 400 includes the wiring layer 132 and the wire covering layer 140. The wire covering layer 140 includes a material that may be hot pressed or be adhesive. In some embodiments, the wire covering layer 140 may be a solder layer or an anisotropic conductive layer. The circuit board 160 may be directly bonded to the wire covering layer 140 through no other bonding media. For example, the circuit board 160 may be attached and bonded to the wire covering layer 140 by hot pressing. The specific structure of the turning wire 250 in FIG. 6 and FIG. 7 and the conductor pad 120 in FIG. 7 may be optionally applied in this embodiment.

In this embodiment, the circuit board 160 is in direct contact with the wire covering layer 140. Accordingly, when the circuit board 160 is bonded to the second surface 114 of the substrate 100, the side edge thickness of the panel device 400 is not apparently increased, thus helping to achieve the narrow border. Furthermore, the circuit board 160 is in direct contact with the wire covering layer 140 through no other bonding media, helping to ensure the electrical connection between the circuit board 160 and the turning wire 150.

Figure 9:
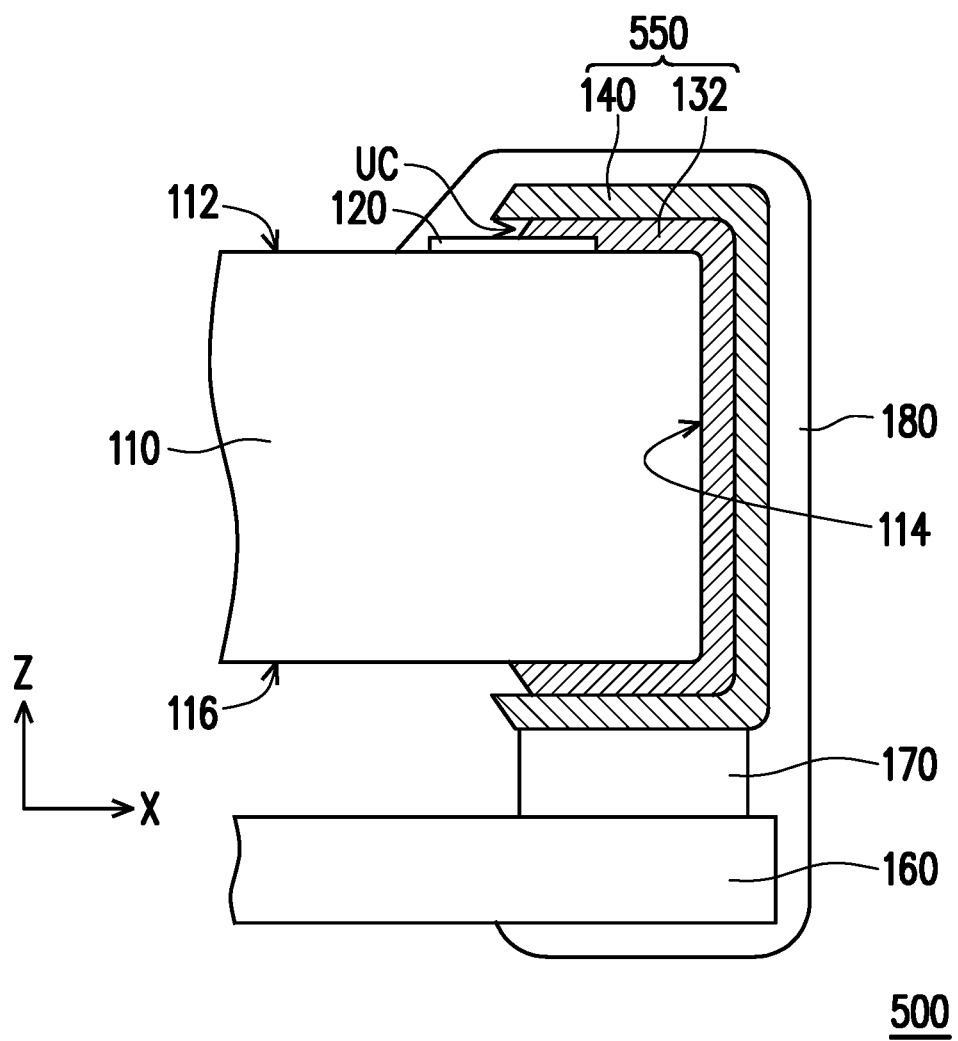

FIG. 9 is a schematic partial cross-sectional view of a panel device according to an embodiment of the disclosure. In FIG. 9, a panel device 500 may include the substrate 110, the conductor pad 120, a turning wire 550, the circuit board 160, and the protective layer 180. The turning wire 550 may be fabricated using the steps of manufacturing of FIG. 1 to FIG. 4. Accordingly, reference may be made to the description of FIG. 1 to FIG. 4 for the relative configuration relationship of the substrate 110, the conductor pad 120, and the turning wire 550. In addition, the panel device 500 is largely similar to the panel device 100, while the panel device 500 is different from the panel device 100 mainly in that, the turning wire 550 in the panel device 500 not only extends from the first surface 112 to the second surface 114, but also extends from the second surface 114 to the third surface 116 of the substrate 110, where the second surface 114 is connected between the third surface 116 and the first surface 112. In other words, the turning wire 500 two turns on the plane in the X direction and the Z direction forming a cross-sectional structure in a U shape.

The turning wire 550 includes the wiring layer 132 and the wire covering layer 140, and may be fabricated on the substrate 110 with reference to the steps of manufacturing of FIG. 1 to FIG. 4. During fabrication of the turning wire 550, the wire covering layer 140 may be fabricated by printing and may continuously extend from the first surface 112 through the second surface 114 to the third surface 116 of the substrate 110. The wiring layer 132 formed by patterning a conductor material layer (e.g., the conductor material layer 130 of FIG. 3) with the wire covering layer 140 serving as a mask may have an outline that conforms to the wire covering layer 140, and may also continuously extend from the first surface 112 through the second surface 114 to the third surface 116 of the substrate 110. The outline of the wiring layer 132 may be recessed relative to the outline of the wire covering layer 140 to form the undercut structure UC distributed along the periphery of the turning wire 550.

In FIG. 9, the circuit board 160 may be disposed on the third surface 116 of the substrate 110. The circuit board 160 may be bonded to the part of the turning wire 550 on the third surface 116 through the conductive bonding layer 170. Accordingly, the turning wire 550, the conductive bonding layer 170, and the circuit board 160 are sequentially disposed on the third surface 116 along a direction gradually away from the first surface 112. That is, the turning wire 550, the conductive bonding layer 170, and the circuit board 160 are stacked in the normal direction of the third surface 116. Accordingly, the turning wire 550 may electrically connect the conductor pad 120 on the first surface 112 to the circuit board 160 on the third surface 116, reducing the area occupied by the structure on the first surface 112 for bonding the circuit board 160. Thereby, the area where functional elements such as light-emitting elements and display elements may be disposed on the first surface 112 of the panel device 500 is increased. For example, the functional elements disposed on the first surface 112 may be closer to the second surface 114 to achieve a design with a narrow border or even nearly no border. In some embodiments, the conductive bonding layer 170 may be omitted, and the circuit board 160 may be in direct contact with the wire covering layer 140 of the turning wire 550. In some other embodiments, additional pads may be further disposed on the third surface 116 of the substrate 110, and the circuit board 160 may be electrically connected to the turning wire 550 through the additional pads. In this embodiment, the protective layer 180 may be distributed along an approximate U-shaped path, and may cover the turning wire 550 and partially cover the circuit board 160.

In some embodiments, the wiring layer 132 of the turning wire 550 may have a multilayer structure as shown in FIG. 6. In some embodiments, the conductor pad 120 may have a multilayer structure as shown in FIG. 7. In other words, the wiring layer 232 of FIG. 6 and the conductor portion 122 and the surface portion 124 of FIG. 7 may be applied in this embodiment serving as possible implementations of the wiring layer 132 and the conductor pad 120.

In summary of the foregoing, the panel device according to the embodiments of the disclosure is provided with the turning wire continuously extending from the first surface to the second surface of the substrate on the edge of the substrate. Circuit structures, such as a circuit board, intended to be bonded to the panel device may be bonded to the turning wire on the second surface or the third surface of the panel device. Accordingly, the area required for bonding the circuit board on the first surface can be reduced to achieve a design with a narrow border or even nearly no border. Furthermore, the turning wire has at least a bilayer design, and the outer layer is the wire covering layer with conductivity. Therefore, in some embodiments, the circuit board may be directly bonded to the conductive cover layer, helping to reduce the thickness required for the bonding structure. The required panel device has good quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A panel device, comprising:
   a substrate, having a first surface and a second surface connected to the first surface, wherein a normal direction of the second surface is different from a normal direction of the first surface;
   a conductor pad, disposed on the first surface of the substrate;
   a turning wire, disposed on the substrate and extending from the first surface to the second surface, wherein the turning wire comprises a wiring layer in contact with the conductor pad and a wire covering layer covering the wiring layer; and
   a circuit board, bonded to the wire covering layer and electrically connected to the wire covering layer,
   wherein an area of the projection of the wire covering layer on the first surface is greater than an area of the projection of the wiring layer on the first surface.

2. The panel device according to claim 1, wherein an outline of the wiring layer is recessed relative to an outline of the wire covering layer.

3. The panel device according to claim 1, wherein a conductivity of the wiring layer is greater than a conductivity of the wire covering layer.

4. The panel device according to claim 1, wherein the wire covering layer is an anisotropic conductive layer, a solder layer, a silver paste layer, or a combination thereof.

5. The panel device according to claim 1, further comprising a conductive bonding layer, wherein the circuit board is bonded to the wire covering layer through the conductive bonding layer.

6. The panel device according to claim 1, wherein a heterogeneous contact interface is present between the conductive pad and the wiring layer.

7. The panel device according to claim 1, wherein the circuit board is in direct contact with the wire covering layer.

8. The panel device according to claim 1, wherein the substrate further has a third surface connected to the second surface, the second surface is connected between the third surface and the first surface, and the turning wire further extends to the third surface.

* * * * *